US011533053B2

(12) United States Patent
Delshadpour et al.

(10) Patent No.: US 11,533,053 B2
(45) Date of Patent: Dec. 20, 2022

(54) PROGRAMMABLE ASK DEMODULATOR

(71) Applicant: NXP B.V., Eindhoven (NL)

(72) Inventors: Siamak Delshadpour, Phoenix, AZ (US); Xiaoqun Liu, Chandler, AZ (US); Steven Daniel, Gilbert, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/032,784

(22) Filed: Sep. 25, 2020

(65) Prior Publication Data

US 2022/0103174 A1    Mar. 31, 2022

(51) Int. Cl.
| | | |
|---|---|---|
| H03K 19/0185 | (2006.01) | |
| H03K 19/09 | (2006.01) | |
| H03K 5/24 | (2006.01) | |
| H03K 5/15 | (2006.01) | |
| H03K 7/06 | (2006.01) | |

(52) U.S. Cl.
CPC . *H03K 19/018521* (2013.01); *H03K 5/15073* (2013.01); *H03K 5/2409* (2013.01); *H03K 7/06* (2013.01); *H03K 19/09* (2013.01)

(58) Field of Classification Search
CPC ... H03F 1/00; H03F 1/303; H03F 3/00; H03F 3/45183; H03F 3/45475; H03F 3/45973; H03K 7/00; H03K 7/06; H03K 19/00; H03K 19/018521; H03K 19/09; H03K 5/00; H03K 5/003; H03K 5/15073; H03K 5/2409
USPC ........................................................ 327/307
See application file for complete search history.

(56) References Cited

U.S. PATENT DOCUMENTS

| | | | |
|---|---|---|---|
| 4,451,792 A * | 5/1984 | Gay | H03D 3/00 329/319 |
| 7,876,150 B2 | 1/2011 | Iwata et al. | |
| 8,200,179 B1 * | 6/2012 | Mosinskis | H04L 25/03254 455/240.1 |
| 10,594,285 B1 * | 3/2020 | Delshadpour | G06F 11/3051 |

(Continued)

OTHER PUBLICATIONS

B. Chi, et al. "A Fast-Settling Wideband-IF ASK Baseband Circuit for a Wireless Endoscope Capsule," in IEEE Transactions on Circuits and Systems II: Express Briefs, vol. 56, No. 4, pp. 275-279, Apr. 2009, doi: 10.1109/TCSII.2009.2015397.

(Continued)

*Primary Examiner* — Diana J. Cheng
*Assistant Examiner* — Dave Mattison

(57) ABSTRACT

Various embodiments relate to an amplitude shift keying (ASK) demodulator for demodulating an input signal, including: a frequency filter configured to receive the input signal, wherein the frequency filter includes adjustable components configured to adjust the frequency response of the frequency filter; a rectifier configured to rectify an output of the frequency filter, wherein the rectifier includes an adjustable current source configured to adjust the current consumption of the rectifier; a reference signal generator configured to produce a reference signal; a current to voltage converter configured to convert the current of the rectified signal to a rectified voltage and to convert the current of the reference signal to a reference voltage; and a comparator configured to compare the rectified voltage to the reference voltage and to produce a demodulated output signal.

20 Claims, 7 Drawing Sheets

(56) References Cited

U.S. PATENT DOCUMENTS

| | | | |
|---|---|---|---|
| 2004/0056691 A1* | 3/2004 | Prexl | H03K 3/02337 327/90 |
| 2009/0027111 A1* | 1/2009 | Nito | H03F 3/3432 327/538 |
| 2013/0182797 A1 | 7/2013 | Liu et al. | |
| 2019/0156949 A1 | 5/2019 | Lee et al. | |
| 2019/0260619 A1 | 8/2019 | Rada | |
| 2020/0076474 A1 | 3/2020 | Daga et al. | |

OTHER PUBLICATIONS

M. J., Choi, et al. "Design of low power ASK CMOS demodulator circuit for RFID tag: Design of All-MOSFET low power ASK demodulator," 2010 IEEE International Conference of Electron Devices and Solid-State Circuits (EDSSC), Hong Kong, 2010, pp. 1-4, doi:.

H. Zhang, et al. "A wide-input-range low-power ASK demodulator for wireless data transmission in retinal prosthesis," 2016 IEEE Biomedical Circuits and Systems Conference (BioCAS), Shanghai, 2016, pp. 492-495, doi: 10.1109/BioCAS.2016.7833839.

N. Mousavi, et al. "Ultra-low power current mode all-MOS ASK demodulator for radio frequency identification applications," in IET Circuits, Devices & Systems, vol. 10, No. 2, pp. 130-134, Mar. 2016, doi: 10.1049/iet-cds.2014.0252.

T. Lee, et al. "All-MOS ASK Demodulator for Low-Frequency Applications," in IEEE Transactions on Circuits and Systems II: Express Briefs, vol. 55, No. 5, pp. 474-478, May 2008, doi: 10.1109/TCSII.2007.912687.

Y. Miao, et al. "Adjustable Duty Cycle ASK Demodulator for Passive UHF RFID Tags"; IEEE International Conference on Electron Devices and Solid-State Circuits, Hong Kong, CN; pp. 259-262 (2016).

* cited by examiner

PROGRAMMABLE ASK DEMODULATOR

TECHNICAL FIELD

Various exemplary embodiments disclosed herein relate generally to a wideband/wide dynamic range programmable amplitude shift Keying (ASK) demodulator.

BACKGROUND

Amplitude shift keying (ASK) is a type of amplitude modulation which represents the binary data in the form of variations in the amplitude of a signal. Any modulated signal has a frequency carrier. The binary signal when ASK modulated, gives a zero value (or a low amplitude value) for a low input of binary data while it provides the carrier output with higher amplitude for a high input of binary data. In this way digital 1's and 0's may be modulated onto the carrier frequency. The received signal is then demodulated and digital data recovered.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a amplitude shift keying (ASK) demodulator for demodulating an input signal, including: a frequency filter configured to receive the input signal, wherein the frequency filter includes adjustable components configured to adjust the frequency response of the frequency filter; a rectifier configured to rectify an output of the frequency filter, wherein the rectifier includes an adjustable current source configured to adjust the current consumption of the rectifier; a reference signal generator configured to produce a reference signal; a current to voltage converter configured to convert the current of the rectified signal to a rectified voltage and to convert the current of the reference signal to a reference voltage; and a comparator configured to compare the rectified voltage to the reference voltage and to produce a demodulated output signal.

Various embodiments are described, wherein the adjustable components include a first adjustable resistor and a first adjustable capacitor.

Various embodiments are described, wherein the adjustable components include a first adjustable resistor and a first adjustable capacitor connected to a first input and a second adjustable resistor and a second adjustable capacitor connected to a second input.

Various embodiments are described, wherein the current to voltage converter includes: a first variable resistor having a first terminal connected to a voltage supply and a second terminal connected to the rectifier and a first input of the comparator; a second variable resistor having a first terminal connected to the voltage supply and a second terminal connected to the reference signal generator and a second input of the comparator; and a capacitor connected between the second terminal of the first variable resistor and the second terminal of the second variable resistor, wherein the first and second variable resistors are adjusted to adjust the current consumption of the ASK demodulator.

Various embodiments are described, further including a first trim current source connected to the second terminal of the first variable resistor and a second trim current source connected to the second terminal of the second variable resistor, wherein the first and second trim current sources are configured to compensate for mismatches in the ASK modulator.

Various embodiments are described, wherein the rectifier and the reference signal generator include a plurality of bipolar transistors.

Various embodiments are described, wherein the rectifier and the reference signal generator include a plurality of complementary metal-oxide-semiconductor (CMOS) transistors.

Various embodiments are described, wherein the input signal is a differential signal.

Various embodiments are described, wherein the reference signal generator receives a differential reference voltage.

Various embodiments are described, wherein the input signal is a single ended signal.

Various embodiments are described, further including: a first circuit configured to generate a first current based on a common mode voltage of the input signal; and a second circuit configured to generate a second current based on a common mode voltage of an input reference signal, wherein the rectifier is configured to generate a third current, wherein the reference signal generator is configured to generate a fourth current, and wherein comparator produces the demodulated output signal based upon the first, second, third, and fourth currents.

Further various embodiments relate to a amplitude shift keying (ASK) demodulator for demodulating an input signal, including: a frequency filter configured to receive the input signal, wherein the frequency filter includes adjustable components configured to adjust the frequency response of the frequency filter; a rectifier configured to rectify an output of the frequency filter, wherein the rectifier includes an adjustable current source configured to adjust the current consumption of the rectifier; a reference signal generator configured to produce a reference signal; a current to voltage converter configured to convert the current of the rectified signal to a rectified voltage and to convert the current of the reference signal to a reference voltage further including: a first transistor having a first terminal connected to a voltage supply and a second terminal connected to the rectifier; a second transistor having a first terminal connected to the voltage supply and a second terminal connected to the reference signal generator; and a capacitor connected between the second terminal of the first transistor and the second terminal of the second transistor; a first current mirror having a third transistor and fourth transistor connected between the voltage supply and ground, wherein the third transistor is a scaled version of the first transistor with a scale factor of n and wherein the control terminal for the third transistor is connected to the control terminal of the first transistor; a second current mirror having a fifth transistor and sixth transistor connected between the voltage supply and ground, wherein the fifth transistor is a scaled version of the second transistor with the scale factor of n, wherein the control terminal for the fifth transistor is connected to the control terminal of the second transistor, and wherein a control terminal of the sixth transistor is connected to a control terminal of the fourth transistor; and a buffer configured to produce a demodulated output signal based upon a current difference between the first and second current mirrors.

Various embodiments are described, further including a trim current source connected to the second terminal of the fifth transistor, wherein the trim current source is configured to compensate for mismatches in the ASK modulator.

Various embodiments are described, wherein the adjustable components include a first adjustable resistor and a first adjustable capacitor.

Various embodiments are described, wherein the adjustable components include a first adjustable resistor and a first adjustable capacitor connected to a first input and a second adjustable resistor and a second adjustable capacitor connected to a second input.

Various embodiments are described, wherein the rectifier and the reference signal generator include a plurality of bipolar transistors.

Various embodiments are described, wherein the rectifier and the reference signal generator include a plurality of complementary metal-oxide-semiconductor (CMOS)transistors.

Various embodiments are described, wherein the input signal is a differential signal.

Various embodiments are described, wherein the reference signal generator receives a differential reference voltage.

Various embodiments are described, wherein the input signal is a single ended signal.

Various embodiments are described, further including: a first circuit configured to generate a first current based on a common mode voltage of the input signal; and a second circuit configured to generate a second current based on a common mode voltage of an input reference signal, wherein the rectifier is configured to generate a third current, wherein the reference signal generator is configured to generate a fourth current, and wherein buffer produces the demodulated output signal based upon the first, second, third, and fourth currents and the scale factor n.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

Figure 1:
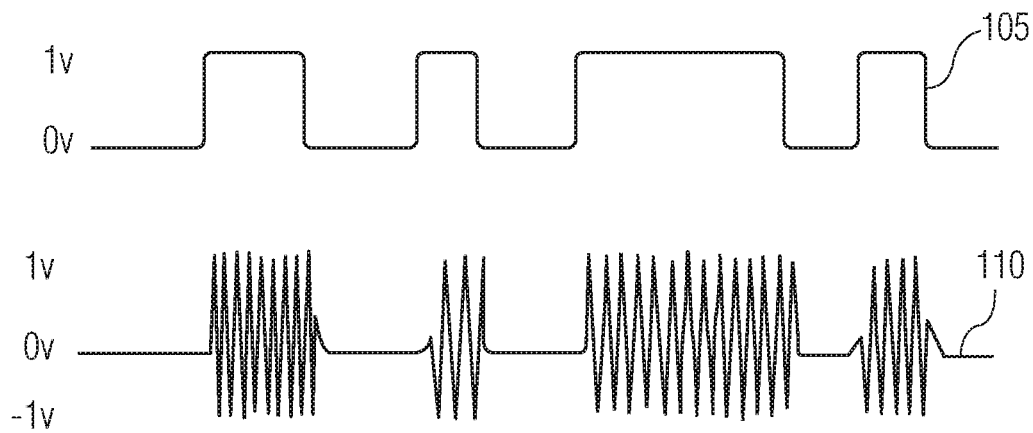
FIG. 1 illustrates an ASK modulated waveform along with its input.

Amplitude shift keying (ASK) is a type of amplitude modulation which represents the binary data in the form of variations in the amplitude of a signal. Any modulated signal has a frequency carrier. The binary signal when ASK modulated, provides a zero value (or a low value) for a low input while it provides the carrier output for a high input. FIG. 1 illustrates an ASK modulated waveform along with its input. The input signal 105 is a digital signal with two different values indicating a 0 or 1. A high frequency carrier is modulated by the input signal 105 to generate the ASK modulated signal 110. The ASK modulated signal 110 is shown has having a zero value when the input signal 105 is zero, and the carrier wave is transmitted when the input signal 105 is 1. It is noted that the input values for 0 and 1 could be interchanged. Also, the ASK modulated signal 110 may more generally also have a low value rather than a zero value.

Figure 2:
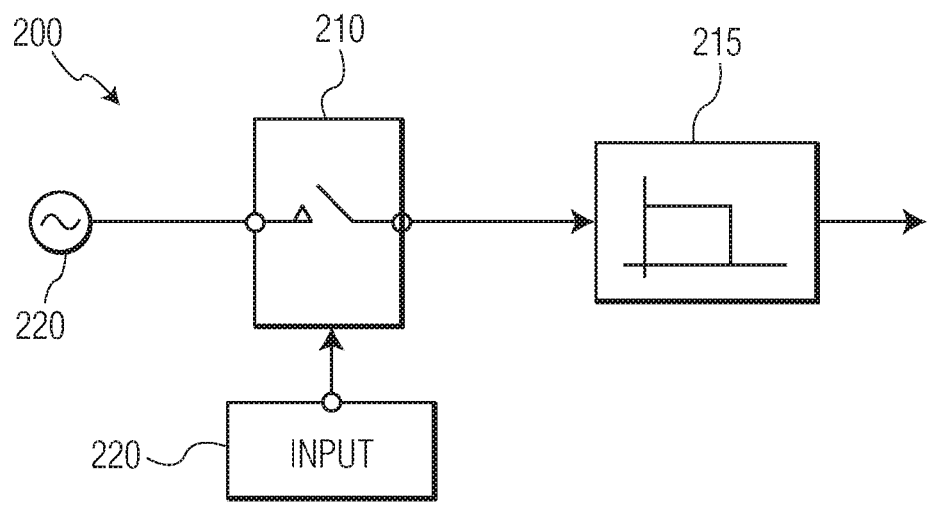
FIG. 2 illustrates a block diagram of an embodiment of an ASK modulator.

FIG. 2 illustrates a block diagram of an embodiment of an ASK modulator. The ASK modulator 200 includes a carrier signal generator 205, a switch 210 controlled by the binary sequence from the input signal 220, and a band-limited filter 215. The carrier signal generator 205 produces a continuous high-frequency carrier. The switch 210 connects the carrier signal to the band-limited filter 215 based upon the input signal 220. For example, when the input has a high value, the switch is closed so that carrier signal is output, and when the input has a low value the switch is open so that the output is zero. The band-limited filter 215 shapes the pulse depending upon the amplitude and phase characteristics of the band-limiting filter to produce a bandlimited ASK signal.

There are two ASK demodulation techniques. They are asynchronous ASK demodulation/detection and synchronous ASK demodulation/detection. When the clock frequency at the transmitter, matches the clock frequency at the receiver, it is known as synchronous detection, as the frequency gets synchronized. Otherwise, ASK demodulation is known as asynchronous detection. The focus of the embodiments described herein are asynchronous demodulation.

Figure 3:
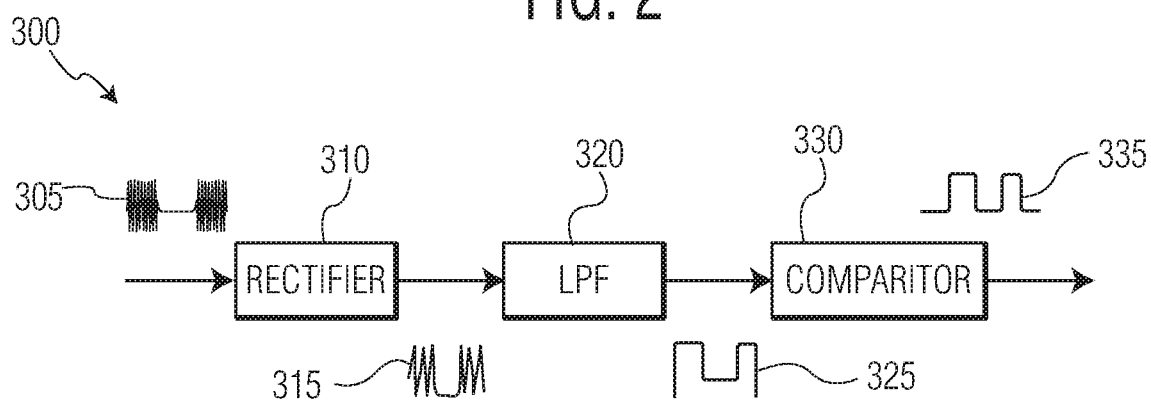
FIG. 3 illustrates an embodiment of an asynchronous ASK demodulator.

FIG. 3 illustrates an embodiment of an asynchronous ASK demodulator. The ASK demodulator 300 includes a rectifier 310, a low pass filter (LPF) 320, and a comparator 330. The modulated ASK signal 305 is received by the rectifier which may be a half-wave rectifier and produces a rectified signal 315. The low pass filter 320 receives the rectified signal 315 and suppresses the higher frequencies producing an envelope detected output 325. The comparator 335 compares the envelop detected output 325 to a threshold value and produces a digital output.

Developing an ASK demodulator that supports a wide dynamic range and wide frequency range input signal with programmability is a challenge. Also, developing a fully integrated implementation that is fast and low current is also challenging.

Embodiments of an ASK demodulator described herein provide the following beneficial features: low supply range; wide dynamic range; wide frequency range; programmable low/high threshold; programmable frequency; programmable current for different speeds and power consumption levels; offset calibration to support small amplitude levels; asynchronous design so no switching is needed; works in current mode which makes it good for high-speed applications; is fully differential; may be used for single ended applications as well; and the architecture allows for the ASK demodulator to be directly connected to the input pads.

Figure 4:
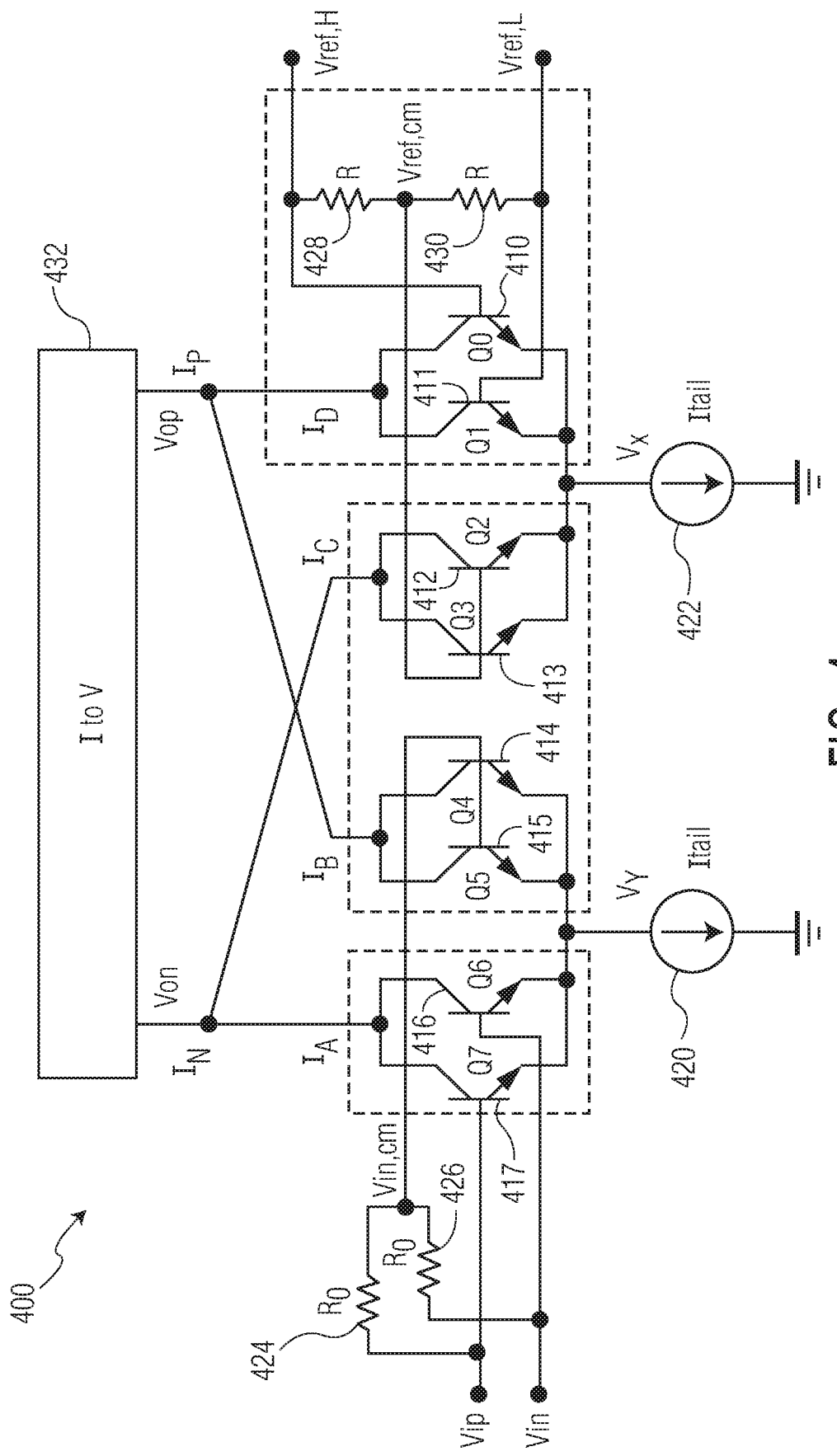
FIG. 4 illustrates an embodiment of a high speed rectifier.

FIG. 4 illustrates an embodiment of a high speed rectifier. The rectifier 400 receives a differential input $V_{ip}$ and $V_{in}$ as well as differential reference voltages $V_{nf,H}$ and $V_{nf,L}$. The rectifier 400 includes transistors $Q_0$-$Q_7$ 410-417, a current to voltage (I to V) circuit 432, input resistors 424, 426, reference resistors 428, 430, and current sources 420, 422.

The operation of the rectifier 400 will now be described. The input differential signal $V_{ip}$ and $V_{in}$ are applied to the gates of transistors $Q_7$ 417 and $Q_6$ 416 respectively. The two input resistors $R_0$ 424, 426 produce the input common mode voltage, $V_{in,cm}$ which is applied to the bases of transistors $Q_4$ 414 and $Q_5$ 415.

The following equations describe various voltage relationships:

$$V_{ref,H} - V_{ref,L} = 2*V_{ref} \quad (1)$$

$$(V_{ref,H} + V_{ref,L})/2 = V_{ref,cm} \quad (2)$$

$$V_{ref,cm} - V_X = V_\Delta \quad (3)$$

where $V_{ref,H} - V_{ref,L}$ is the reference voltage compared with the rectified signal.

If $|V_{ref}|$ was much smaller than $V_{BE}$ of the transistors, the incoming signal analysis may be done in small signal domain, however the circuit is working in large signal domain and the analysis needs to be done properly.

When an incoming signal arrives, the rectifier 400 will rectify it. Transistors $Q_7$ 417 and $Q_6$ 416 act as a rectifier and any differential $\Delta V$, $|V_{ip}-V_{in}|$, positive or negative, in their base, will be treated the same way and more current will flow into $Q_6$ 416 and $Q_7$ 416. When $|V_{ip}-V_{in}|$ increases, $I_{Q7}+I_{Q6}$ increases as well. To understand this in detail, the related currents and voltages of circuit of FIG. 4 are calculated. Currents of transistors $Q_0$ to $Q_3$ 410 to 413 may be written as:

$$I_{Q0} = I_s e^{((+Vref+V\Delta)/VT)} \quad (4)$$

$$I_{Q1} = I_s e^{((-Vref+V)/VT)} \quad (5)$$

$$I_{Q2} = I_{Q3} = I_s e^{(V\Delta/VT)} \quad (6)$$

and $I_D$ and $I_C$ may be calculated as:

$$I_D = I_{Q1} + I_{Q0} = I_s e^{(V\Delta/VT)} (e^{(Vref/VT)} + e^{(-Vref/VT)}) \quad (7)$$

$$I_C = I_{Q3} + I_{Q2} = 2 I_s e^{(V\Delta/VT)}. \quad (8)$$

Because "$e^x + e^{-x} \geq 2$" for any $x \geq 0$, then "$I_D \geq I_C$" in any condition and because "$I_D + I_C = I_{tail}$", then equations 7 and 8 provide:

$$I_{tail} = I_s e^{(V\Delta/VT)} (2 + e^{(Vref/Vt)} + e^{(-Vref/VT)}), \quad (9)$$

and recalculation of equations 7, 8 and 9 results in:

$$I_D - I_C = I_{tail}(1 - 4/(2 + e^{(Vref/VT)} + e^{(-Vref/VT)})), \quad (10)$$

which shows that when $V_{ref}$ increases, $I_D - I_C$ increases too. Similar to equation 10, the currents may be calculated for the input signal side as well. Considering '$V_{input} = V_{ip} - V_{in}$' and doing similar calculation as was done to achieve equation 10 will provide:

$$I_A - I_B = I_{tail}(1 - 4/(2 + e^{(Vinput/VT)} + e^{(-Vinput/VT)})). \quad (11)$$

As $V_{input}$ increases, $I_A - I_B$ increases as well. The final output branches of the rectifier side and $V_{ref}$ side will be $I_N$ and $I_P$ branches where:

$$I_N = I_A + I_C \quad (12)$$

$$I_P = I_B + I_D \quad (13)$$

and the differential input the I to V convertor 432 will turn $I_N - I_P$ to a voltage, $V_{op} - V_{on}$. $I_N - I_P$ may be computed as:

$$I_N - I_P = (I_A + I_C) - (I_B + I_D) = (I_A - I_B) - (I_D + I_C) \quad (14)$$

Or equally:

$$I_N - I_P = 4 i_{tail}(1/(2 + e^{(Vref/VT)} + e^{(-Vref/VT)}) - 1/(2 + e^{(Vinput/VT)} + e^{(-Vinput/VT)})) \quad (15)$$

It can be easily seen from current equations of 15 that when $V_{input} = |V_{ip} - V_{in}| > (V_{ref,H} - V_{ref,L})$, then $(I_N - I_P) > 0$, or equally $(V_{op} - V_{on}) > 0$.

Figure 5A:
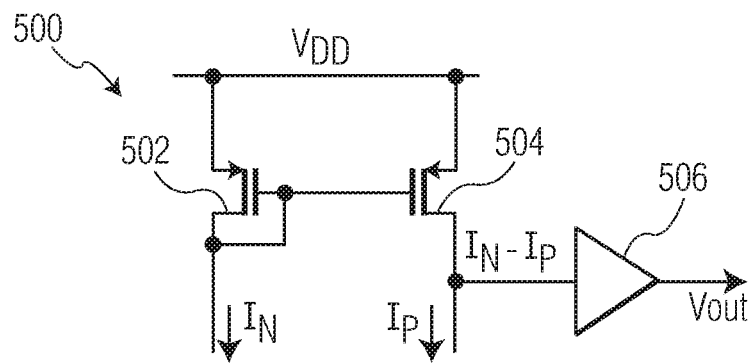
FIGS. 5A-5C illustrate various embodiments of a I to V converters.
Figure 5B:
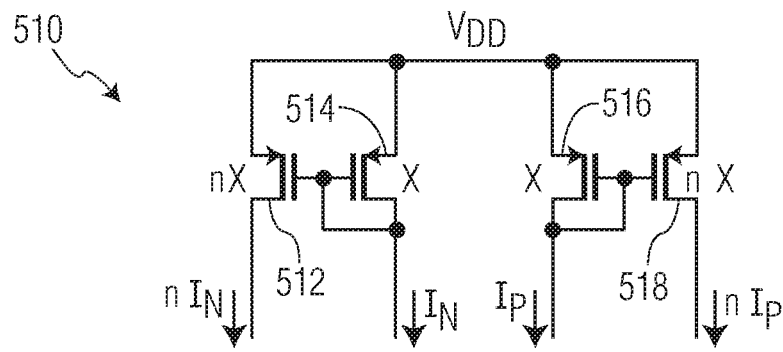
Figure 5C:
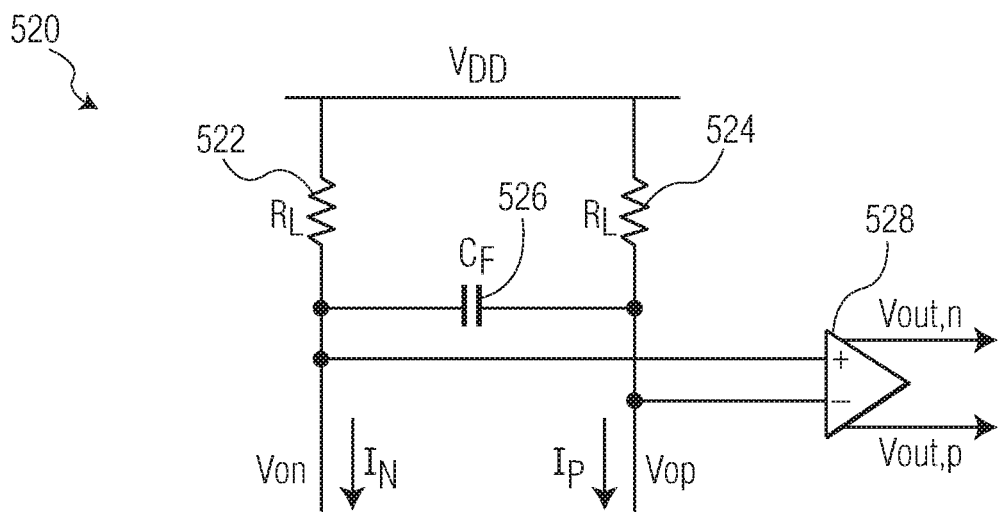

FIGS. 5A-5C illustrate various embodiments of I to V converters.

FIGS. 5A and 5B have an op-amp like structure. I to V converter 500 of FIG. 5A uses transistors 502 and 504 to produce $I_N - I_P$, and the buffer converts $I_N - I_P$ to produce a voltage Vout. FIG. 5B illustrates a differential version that uses four transistors 512, 514, 516, 518, where transistors 512 and 518 are scaled versions of transistors 514 and 516 respectively.

FIG. 5C illustrates a simple and low voltage version of the I to V converter 520 that does not need any extra headroom as the two previous examples. The I to V converter 520 includes resistors 522, 524, capacitor 526, and amplifier 528. The I to V converter 520 converts $I_N$ and $I_P$ to Von and Vop that will be amplified and brought to a CMOS level demodulated signal (differential output is shown, but it can be single ended as well). Also, the added capacitor $C_F$ 526 in combination with resistors $R_L$ 522, 524 shape a low pass filter to make Von–Vop smoother.

Figure 6:
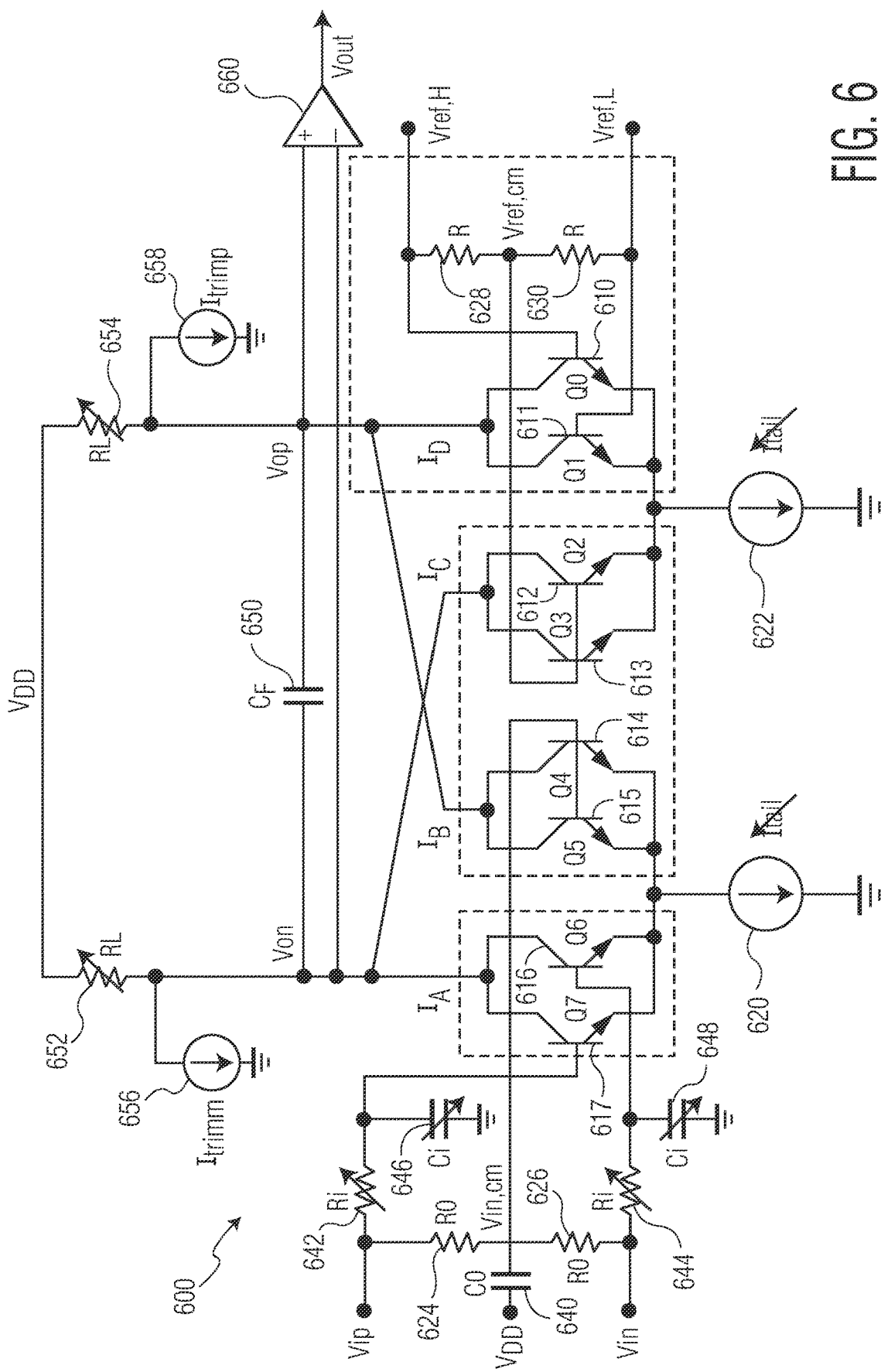
FIG. 6 illustrates a programmable ASK demodulator.

FIG. 6 illustrates a programmable ASK modulator. The ASK modulator 600 includes a high speed rectifier as shown in FIG. 4 with similar numbered items performing the same function. The ASK modulator 600 illustrates a solution for a fully differential input signal, and for a single ended solution, one of the inputs may be connected to a DC voltage.

Resistors $R_0$ 624, 626 in combination with capacitor $C_0$ 640, produce the common mode voltage of the input. Resistors Ri 642, 644 in combination with capacitors Ci 646, 648, form a channel select filter for the incoming signal. Resistors Ri 642, 644 are adjustable and for example may have a 5 bit control allowing for $2^5 = 32$ values. Likewise, capacitors Ci 646, 648 are adjustable and, for example, may have a 5 bit control allowing for $2^5 = 32$ values (two Ri resistors share the same code, also two Ci capacitors share the same code). In this example, $2^5 * 2^5 = 2^{10} = 1024$ different filter setting are possible. Resistors $R_0$ 624, 626 also act as secondary electrostatic discharge (ESD) protection for transistors Q4 614 and Q5 615 if $V_{in}$ and $V_{ip}$ are directly coming from input pads. Resistors Ri do the same job for transistors Q6 616 and Q7 617.

The ASK modulator 600 includes adjustable current sources Itail 620, 622. These current sources 620, 622 may be programed to produce different current values and hence affect the current consumption of the ASK demodulator 600.

The ASK modulator 600 includes a V to I converter like that shown in FIG. 5C. The V to I converter includes adjustable resistors $R_L$ 652, 654, capacitor $C_F$, current trim sources Itrim 656, 658, and an comparing amplifier 660. Capacitor $C_F$ 650 in combination with resistors $R_L$ 652, 654 shape a low pass filter to provide a cleaner output for the rectifier. Resistors $R_L$ 652, 654 also provide gain for the rectified signal in form of current and are adjustable as well. Resistors $R_L$ 652, 654 values may be coordinated with current sources Itail 620, 622 to affect the amount of current used by the ASK modulator. The current sources 620, 622 are adjusted to provide the level of current needed in a specific application to meet speed and power requirements. Depending on the design strategy, both of the $R_L$ and $I_{Tail}$ may be fixed values as well.

$V_{ref,H}$ and $V_{ref,L}$ are reference voltages that may be generated by a programmable reference generator to support different ASK signal levels. Their difference, $(V_{ref,H}-V_{ref,L})$ is important and their common mode value is not very important as long as is within the acceptable limits.

Itrim current sources 656, 658 need one time trim/calibration to compensate all the mismatches associated with all the non-idealities from Vinput to Vout. Any mismatch in components, e.g., offset of transistors in MOS cases, mismatch in resistors and in $V_{ref,H}-V_{ref,L}$, also mismatch in two current sources 620, 622, mismatch in resistors that need to be equal (e.g., two $R_o$, two $R_i$, two $R_L$) will be seen as a DC offset in $V_{op}$ and $V_{on}$. The two current sources 620, 622 will be digitally coded current sources, and these digital codes will be stored in short term memory during automatic calibration or long term memory during production (factory/tester) calibration.

Figure 7:
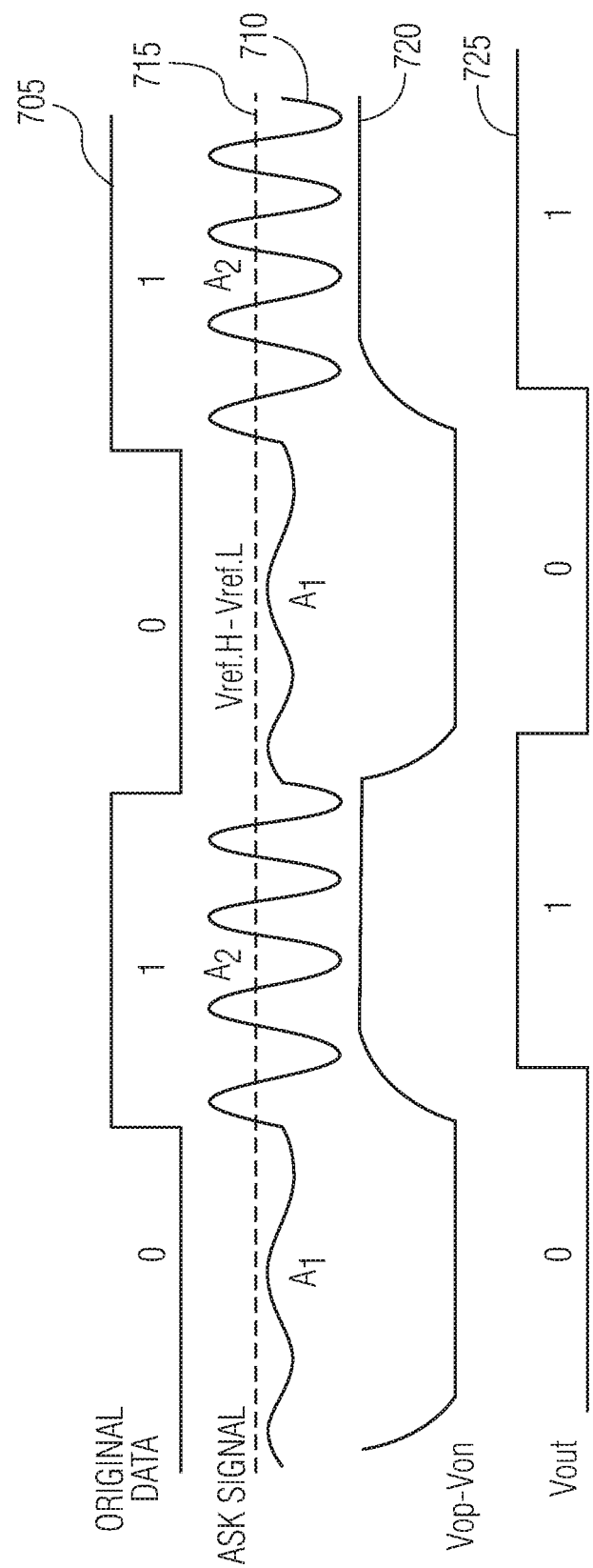
FIG. 7 illustrates plots of the transmitted data, received ASK data, the Vop-Von signal, and the demodulated data.

FIG. 7 illustrates plots of the transmitted data, received ASK data, the $V_{op}-V_{on}$ signal, and the demodulated data. The original digital data is shown in the signal 705 as a series of 1's and 0's. The modulated signal 710 shows the modulated carrier signal that results when the input data is modulated onto the carrier signal. Note, in this example, the low value is not zero, but some other low value that would be below a detection threshold 715, for example, $V_{ref,H}-V_{ref,L}$. The Vop–Von signal 720 shows a demodulated signal that may be used to reconstruct the digital data which is shown in Vout signal 725.

Figure 8:
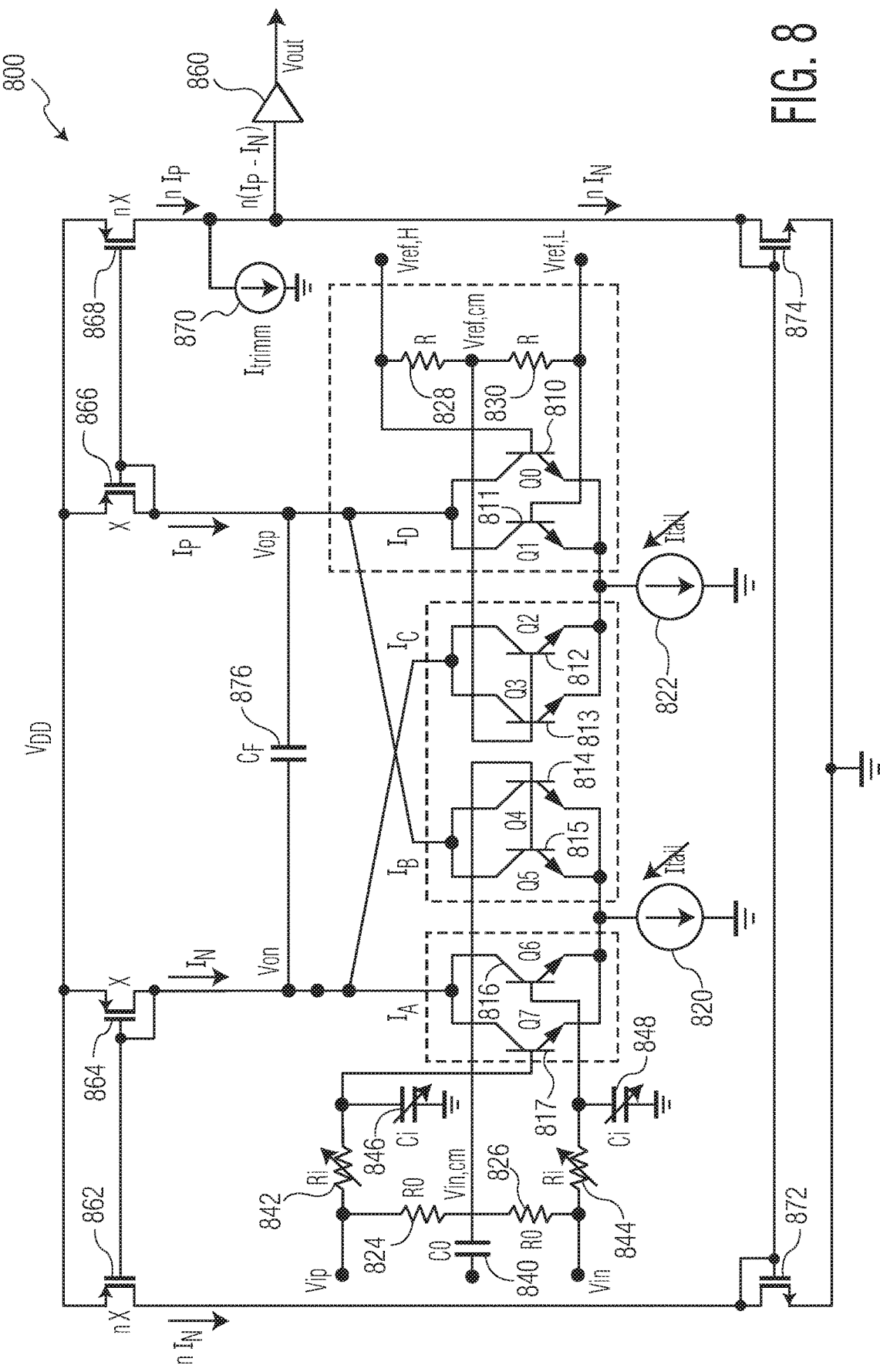
FIG. 8 illustrates a BiCMOS implementation of an ASK modulator.

FIG. 8 illustrates a BiCMOS implementation of an ASK modulator. The ASK modulator 800 includes a high speed rectifier as shown in FIG. 6 with similar numbered items performing the same function. The ASK modulator 800 uses an I to V converter like that shown in FIG. 5B. As a result there are no $R_L$ resistors. Further a single trimming current source 870 will compensate for all the process variations in the circuit.

The multiplication factor n between transistors 862 and 864 as well as 866 and 868 may be as low as 1 if enough gain is produced by the buffer 860 providing Vout. Further, NMOS transistors 872 and 874 corresponding the PMOS transistors 862 and 868 respectively, form current mirrors. These current mirrors along with current sources 820, 822 may be in the form of a cascode current sources if the system supply allows enough headroom. Replacing 862, 864, 866, 868, 872 and 874 with the proper bipolar structure a fully bipolar implementation will be achieved.

Figure 9:
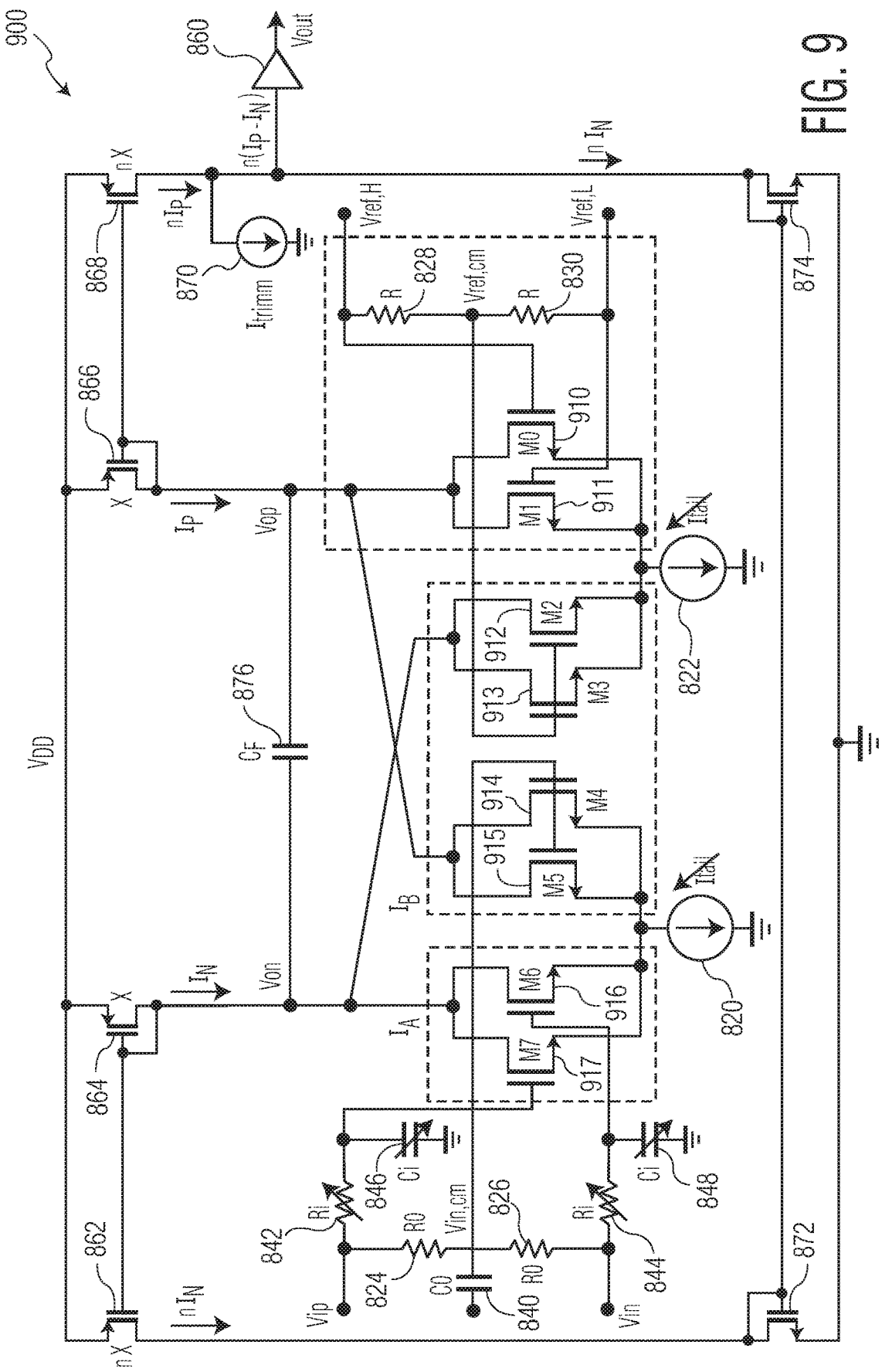
FIG. 9 illustrates a fully CMOS implementation of the ASK demodulator.

FIG. 9 illustrates a fully CMOS implementation of the ASK demodulator. The demodulator 900 is the same as the demodulator 800, but instead replaces the bipolar transistors 810-817 with CMOS transistors 910-917. Although formulas provided above are for the bipolar transistor case, the CMOS ASK modulator 900 follows the same principals.

The ASK demodulators 800 and 900 do not have adjustable resistors $R_L$ as in the ASK modulator 600. Accordingly, the current consumption of the ASK modulator is controlled by the current sources 820, 822. The operation frequency is selected the same as for the ASK modulator 600, i.e., by setting the values of resistors 842, 844 and the capacitors 846, 848.

The ASK demodulator embodiments described herein may be used in various applications that use an ASK modulator, e.g., RFID, NFS, etc. These applications may include low frequency radio frequency (RF) applications, home automation devices, industrial networked devices, wireless base stations, etc. These ASK demodulator embodiments may be used with high or low bitrates, high or low carrier frequencies, and single ended and differential signals. The embodiments allow the ASK demodulator to be adjusted to receive a variety of different frequency bands as well as allowing for various levels of current consumption in order to meet specific power and speed requirements of different applications.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. An amplitude shift keying (ASK) demodulator for demodulating an input signal, comprising:
    a frequency filter configured to receive the input signal, wherein the frequency filter includes adjustable components configured to variably adjust a frequency response of the frequency filter in response to a first set of varying digital codes;
    a rectifier configured to rectify an output of the frequency filter, wherein the rectifier includes an adjustable current source configured to variably adjust a current consumption of the rectifier in response to a second set of varying digital codes;
    a reference signal generator configured to produce a reference signal;
    a current to voltage converter configured to convert a current of a rectified signal to a rectified voltage and to convert a current of the reference signal to a reference voltage; and
    a comparator configured to compare the rectified voltage to the reference voltage and to produce a demodulated output signal;
    wherein the input signal is a differential signal; and
    wherein the reference signal generator receives a differential reference voltage.

2. The ASK demodulator of claim 1,
    wherein the adjustable components include a first adjustable resistor and a first adjustable capacitor.

3. The ASK demodulator of claim 1,
wherein the adjustable components include a first adjustable resistor and a first adjustable capacitor connected to a first input and a second adjustable resistor and a second adjustable capacitor connected to a second input.

4. The ASK demodulator of claim 1, wherein the current to voltage converter includes:
a first variable resistor having a first terminal connected to a voltage supply and a second terminal connected to the rectifier and a first input of the comparator;
a second variable resistor having a first terminal connected to the voltage supply and a second terminal connected to the reference signal generator and a second input of the comparator; and
a capacitor connected between the second terminal of the first variable resistor and the second terminal of the second variable resistor,
wherein the first and second variable resistors are adjusted to adjust the current consumption of the ASK demodulator in response to the second set of varying digital codes received by the adjustable current source.

5. The ASK demodulator of claim 4, further comprising
a first trim current source connected to the second terminal of the first variable resistor and
a second trim current source connected to the second terminal of the second variable resistor,
wherein the first and second trim current sources are configured to compensate for mismatches in the ASK modulator.

6. The ASK demodulator of claim 1,
wherein the rectifier and the reference signal generator comprise a plurality of bipolar transistors.

7. The ASK demodulator of claim 1,
wherein the rectifier and the reference signal generator comprise a plurality of complementary metal-oxide-semiconductor (CMOS)transistors.

8. The ASK demodulator of claim 1,
wherein the input signal is a single ended signal.

9. The ASK demodulator of claim 1, further comprising:
a first circuit configured to generate a first current based on a common mode voltage of the input signal; and
a second circuit configured to generate a second current based on a common mode voltage of an input reference signal,
wherein the rectifier is configured to generate a third current,
wherein the reference signal generator is configured to generate a fourth current, and
wherein comparator produces the demodulated output signal based upon the first, second, third, and fourth currents.

10. An amplitude shift keying (ASK) demodulator for demodulating an input signal, comprising:
a frequency filter configured to receive the input signal, wherein the frequency filter includes adjustable components configured to variably adjust a frequency response of the frequency filter in response to a first set of varying digital codes;
a rectifier configured to rectify an output of the frequency filter, wherein the rectifier includes an adjustable current source configured to variably adjust a current consumption of the rectifier in response to a second set of varying digital codes;
a reference signal generator configured to produce a reference signal;
a current to voltage converter configured to convert a current of a rectified signal to a rectified voltage and to convert a current of the reference signal to a reference voltage further comprising:
a first transistor having a first terminal connected to a voltage supply and a second terminal connected to the rectifier;
a second transistor having a first terminal connected to the voltage supply and a second terminal connected to the reference signal generator; and
a capacitor connected between the second terminal of the first transistor and the second terminal of the second transistor;
a first current mirror having a third transistor and fourth transistor connected between the voltage supply and ground, wherein the third transistor is a scaled version of the first transistor with a scale factor of n and wherein the control terminal for the third transistor is connected to the control terminal of the first transistor;
a second current mirror having a fifth transistor and sixth transistor connected between the voltage supply and ground, wherein the fifth transistor is a scaled version of the second transistor with the scale factor of n, wherein the control terminal for the fifth transistor is connected to the control terminal of the second transistor, and wherein a control terminal of the sixth transistor is connected to a control terminal of the fourth transistor; and
a buffer configured to produce a demodulated output signal based upon a current difference between the first and second current mirrors.

11. The ASK demodulator of claim 10, further comprising
a trim current source connected to the second terminal of the fifth transistor,
wherein the trim current source is configured to compensate for mismatches in the ASK modulator.

12. The ASK demodulator of claim 10,
wherein the adjustable components include a first adjustable resistor and a first adjustable capacitor.

13. The ASK demodulator of claim 10,
wherein the adjustable components include a first adjustable resistor and a first adjustable capacitor connected to a first input and a second adjustable resistor and a second adjustable capacitor connected to a second input.

14. The ASK demodulator of claim 10,
wherein the rectifier and the reference signal generator comprise a plurality of bipolar transistors.

15. The ASK demodulator of claim 10,
wherein the rectifier and the reference signal generator comprise a plurality of complementary metal-oxide-semiconductor (CMOS)transistors.

16. The ASK demodulator of claim 10,
wherein the input signal is a differential signal.

17. The ASK demodulator of claim 16,
wherein the reference signal generator receives a differential reference voltage.

18. The ASK demodulator of claim 10,
wherein the input signal is a single ended signal.

19. The ASK demodulator of claim 10, further comprising:
a first circuit configured to generate a first current based on a common mode voltage of the input signal; and
a second circuit configured to generate a second current based on a common mode voltage of an input reference signal, wherein the rectifier is configured to generate a third current, wherein the reference signal generator is configured to generate a fourth current, and wherein buffer produces the demodulated output signal based upon the first, second, third, and fourth currents and the scale factor n.

20. An amplitude shift keying (ASK) demodulator for demodulating an input signal, comprising:

a frequency filter configured to receive the input signal, wherein the frequency filter includes adjustable components configured to variably adjust a frequency response of the frequency filter in response to a first set of varying digital codes;

a rectifier configured to rectify an output of the frequency filter, wherein the rectifier includes an adjustable current source configured to variably adjust a current consumption of the rectifier in response to a second set of varying digital codes;

a reference signal generator configured to produce a reference signal;

a current to voltage converter configured to convert the current of the rectified signal to a rectified voltage and to convert the current of the reference signal to a reference voltage; and a comparator configured to compare the rectified voltage to the reference voltage and to produce a demodulated output signal.

* * * * *